(12) United States Patent
Saidou et al.

(10) Patent No.: US 9,661,748 B2
(45) Date of Patent: May 23, 2017

(54) PRINTED CIRCUIT BOARD AND METHOD OF MANUFACTURING THE SAME

(71) Applicant: FANUC CORPORATION, Yamanashi (JP)

(72) Inventors: Norihiro Saidou, Yamanashi (JP); Takeshi Sawada, Yamanashi (JP)

(73) Assignee: FANUC CORPORATION, Yamanashi (JP)

( * ) Notice: Subject to any disclaimer, the term of this patent is extended or adjusted under 35 U.S.C. 154(b) by 0 days.

(21) Appl. No.: 14/699,078

(22) Filed: Apr. 29, 2015

(65) Prior Publication Data

US 2015/0319851 A1 Nov. 5, 2015

(30) Foreign Application Priority Data

Apr. 30, 2014 (JP) .................. 2014-093798

(51) Int. Cl.
| | | |
|---|---|---|
| H05K 1/02 | (2006.01) |
| H05K 3/00 | (2006.01) |
| H05K 1/09 | (2006.01) |
| H05K 3/34 | (2006.01) |
| H05K 3/06 | (2006.01) |
| H05K 3/24 | (2006.01) |

(52) U.S. Cl.
CPC ............ *H05K 1/0284* (2013.01); *H05K 1/09* (2013.01); *H05K 3/0091* (2013.01); *H05K 3/3468* (2013.01); *H05K 3/06* (2013.01); *H05K 3/243* (2013.01); *H05K 3/244* (2013.01); *H05K 2201/0355* (2013.01); *H05K 2203/0353* (2013.01); *H05K 2203/0445* (2013.01); *H05K 2203/0554* (2013.01); *H05K 2203/073* (2013.01)

(58) Field of Classification Search
CPC ............... H05K 1/09; H05K 3/24; H05K 3/34
USPC .................................. 174/261, 251
See application file for complete search history.

(56) References Cited

U.S. PATENT DOCUMENTS

| | | | | |
|---|---|---|---|---|
| 8,309,856 B2 * | 11/2012 | Kuroda | ................. | H05K 3/244 174/257 |
| 8,519,270 B2 * | 8/2013 | Chang | ................. | H05K 3/4697 174/250 |
| 9,107,332 B2 * | 8/2015 | Hu | ....................... | H05K 3/3452 |

(Continued)

FOREIGN PATENT DOCUMENTS

| | | |
|---|---|---|
| JP | 5-55729 A | 3/1993 |
| JP | 2001-144145 A | 5/2001 |

(Continued)

OTHER PUBLICATIONS

Office Action mailed Sep. 15, 2015, corresponding to Japanese Patent Application No. 2014-093798.

(Continued)

*Primary Examiner* — Timothy Thompson
*Assistant Examiner* — Michael F McAllister
(74) *Attorney, Agent, or Firm* — Hauptman Ham, LLP

(57) ABSTRACT

A printed circuit board includes, an insulating substrate, a metal conductor which is formed on the insulating substrate, a solder resist coating a part of the metal conductor, a scooped-out portion of the metal conductor formed in the vicinity of an end of the solder resist, and a metal layer coating the scooped-out portion.

2 Claims, 2 Drawing Sheets

(56) References Cited

U.S. PATENT DOCUMENTS

| | | | | |
|---|---|---|---|---|
| 2003/0178229 A1* | 9/2003 | Toyoda | ................ | H01L 21/486 |
| | | | | 174/261 |
| 2008/0166550 A1* | 7/2008 | Inoue | ...................... | G03C 5/00 |
| | | | | 428/336 |
| 2008/0257595 A1* | 10/2008 | Hu | .................... | H01L 23/49816 |
| | | | | 174/261 |
| 2008/0308302 A1* | 12/2008 | Lin | ........................ | H05K 3/282 |
| | | | | 174/250 |

FOREIGN PATENT DOCUMENTS

| | | |
|---|---|---|
| JP | 2004-297102 A | 10/2004 |
| JP | 2008-306159 A | 12/2008 |

OTHER PUBLICATIONS

Office Action mailed Jun. 30, 2015, corresponding to Japanese patent application No. 2014-093798.

\* cited by examiner

PRINTED CIRCUIT BOARD AND METHOD OF MANUFACTURING THE SAME

RELATED APPLICATIONS

The present application claims priority to Japanese Application Number 2014-093798, filed Apr. 30, 2014, the disclosure of which is hereby incorporated by reference herein in its entirety.

BACKGROUND OF THE INVENTION

Field of the Invention

The present invention relates to a printed circuit board which interconnects electronic parts such as an IC and a LSI circuit, and a method of manufacturing the same.

Description of the Related Art

There is a problem that failure of a printed circuit board such as disconnection and short circuit occurs due to corrosion or electrolytic corrosion. Specifically, in a factory environment where a facility such as a machine tool is used, greasy fumes and smoke fog (mist) of a cutting fluid, generated in the course of shaping a workpiece (object to be worked), intrude into the inside of a housing of electrical/electronic equipment, and adhere to the surface of a printed circuit board on which electronic parts such as a LSI circuit and an IC are mounted. As a result, failure of the printed circuit board occurs due to corrosion or electrolytic corrosion, which causes a failure of the electrical/electronic equipment. In order to secure stable operation of the facility such as the machine tool in factory environment over long period of time, it is very important to improve corrosion resistance of the printed circuit board which is fundamental parts of the electrical/electronic equipment.

FIG. 1 is a view showing a cross-sectional structure of the printed circuit board. In a method of manufacturing the printed circuit board 1, the metal conductor 3 such as a copper foil is stuck onto the surface of an insulating substrate 2. A solder resist 4 which protects a wiring pattern is formed on a portion of the metal conductor 3 that has been formed as the wiring pattern. It is general that after the solder resist 4 has been formed, the surface of the metal conductor 3 is subjected to coating treatment with solder or other metal than the solder to protect the metal conductor 3 of the printed circuit board 1, and/or ensure solderability with a metal conductor for the mounting of the electronic parts. Three processes are conventionally used as a surface treatment method, which are (1) hot air leveling (HAL) process, (2) electroless plating process and (3) electrolytic plating process.

FIG. 2 is a view showing a cross-sectional structure of the printed circuit board 1 which has been subjected only to the hot air leveling (HAL) process (1). The hot air leveling (HAL) process (1) is a surface treatment method. In the HAL process, a printed circuit board is immersed into a molten solder bath. After that, excess solder is blown from the printed circuit board with high-temperature and high-pressure air, while the printed circuit board is raised from the solder bath.

However, there is a problem in this process that in the case of a material having high viscosity such as solder, a solder coat (solder thin film) 5 to be formed on the surface of the metal conductor 3 by the hot air leveling (HAL) process does not easily adhere to the metal conductor 3, at a portion 6 of a particularly small gap between the solder resist 4 and the metal conductor 3 such as a gap between the end of the solder resist 4 and the metal conductor 3.

FIG. 3 is a view showing a cross-sectional structure of the printed circuit board which has been subjected only to the electroless plating process (2).

The electroless plating process (2) is inexpensive and can also shorten a plating time period compared to the electrolytic plating process, and so that it has recently been attracted. In this process, when a displacement-type metal plating solution is used as a plating solution, the plating solution for forming a plating film 7 on the surface of the metal conductor 3 is easy to intrude into a gap between the end of the solder resist 4 and the metal conductor 3. Because of this, in the vicinity of this portion, the supply of plating metal ions becomes insufficient, only the oxidation/dissolution of the metal conductor (for instance, copper foil) 3 is easy to occur, and the metal conductor 3 becomes such a state that the portion is scooped out (dissolved) (see Japanese Patent Laid-Open No. 2001-144145). This scooped-out portion 8 becomes a factor of remarkably impairing corrosion resistance.

The description of (3) will be omitted.

The solder coat plays an important role in terms of preventing the corrosion or electrolytic corrosion of the metal conductor 3.

However, as has been described above, there is such a problem in the hot air leveling (HAL) process (1) that the solder coat 5 does not adhere to the gap between the end of the solder resist 4 and the metal conductor 3 on the printed circuit board 1. There is also a problem in the electroless plating process (2) that the scooped-out portion 8 is formed in the gap between the end of the solder resist 4 and the metal conductor 3. In the case where the printed circuit board is used in a factory environment in which the greasy fumes and the smoke fog (mist) of the cutting fluid are scattered, if there exists a portion which is not coated with the solder, there is a possibility that the corrosion or electrolytic corrosion caused by the cutting liquid starts from the portion, progresses and expands.

SUMMARY OF THE INVENTION

Then, an object of the present invention is to provide a printed circuit board in which such a problem is solved that corrosion resistance is lowered originating in the portion which is not coated with the solder coat in the hot air leveling (HAL) process and the portion in which copper is dissolved in an electroless plating process, and the corrosion resistance is excellent, and to provide a method of manufacturing the same.

The printed circuit board according to the present invention is provided with an insulating substrate, a metal conductor formed on the insulating substrate, and a solder resist coating a part of the metal conductor, and the printed circuit board includes: a scooped-out portion of the metal conductor, formed in a region facing to the end of the solder resist; and a metal layer coating the scooped-out portion.

The method of manufacturing the printed circuit board according to the present invention is a method of manufacturing a printed circuit board provided with an insulating substrate, a metal conductor formed on the insulating substrate, and a solder resist coating a part of the metal conductor, includes: a first step of forming a scooped-out portion in a region facing to the end of the solder resist in the metal conductor, and a second step of coating the scooped-out portion with a metal layer.

In the present invention, the region facing the end of the solder resist in the metal conductor denotes a region on the metal conductor and in the vicinity of the end of the solder resist.

The present invention can provide a printed circuit board in which the problem is solved that corrosion resistance is lowered originating in the portion which is not coated with the solder coat in the hot air leveling (HAL) process and the portion in which copper is dissolved in an electroless plating process, and the corrosion resistance is excellent, and provide a method of manufacturing the same, by having the above described structure or steps.

BRIEF DESCRIPTION OF THE DRAWINGS

The above described and other objects and features according to the present invention will become clear from the description of following examples with reference to the attached drawings. Among those figures.

DETAILED DESCRIPTION OF THE PREFERRED EMBODIMENTS

An embodiment of the present invention will be described below while the description about a conventional technology will be quoted for the same structure and manufacturing method as those in the conventional technology.

<First Step>

Figure 1:
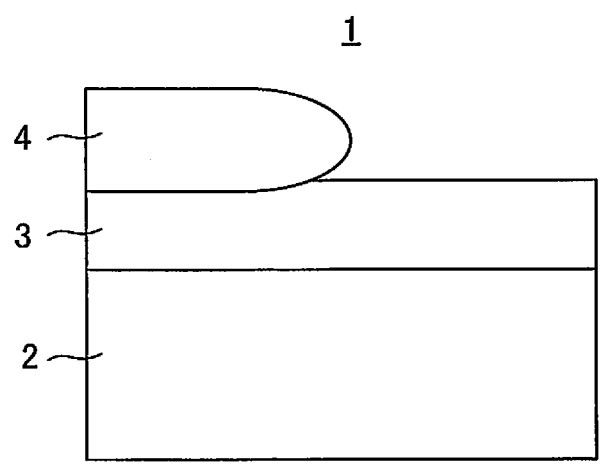
FIG. 1 is a view showing a cross-sectional structure of a printed circuit board.
Figure 2:
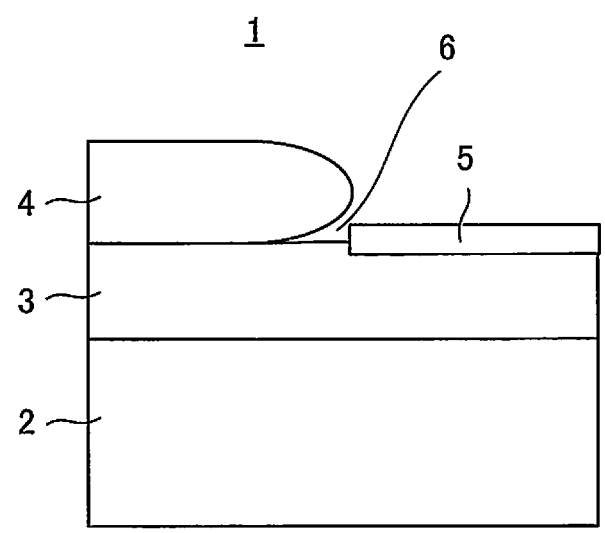
FIG. 2 is a view showing a cross-sectional structure of the printed circuit board which has been subjected only to a hot air leveling (HAL) process.

FIG. 1 is a view showing a cross-sectional structure of a printed circuit board. On the printed circuit board 1, a metal conductor 3 as copper foil is printed on the surface of an insulating substrate 2. An etching resist is applied onto the surface of this metal conductor 3, and is patterned by exposure/development so that the portion of etching resist on a desired wiring pattern is left, and the etching resist other than the portion is removed. Subsequently, the metal conductor 3 of the portion from which the etching resist is removed is selectively removed by an etchant, while the etching resist which has been formed by image development is used as a mask. Furthermore, the etching resist remaining is removed, and thereby the wiring pattern is formed. Incidentally, the method of forming the wiring pattern is not limited to the above described method.

A solder resist 4 is formed which becomes a protective layer for protecting the metal conductor 3 that forms the wiring pattern, in a portion of the metal conductor 3 formed as the wiring pattern, except for a connection portion with a solder ball terminal for the mounting of electronic parts and with the like. FIG. 1 illustrates the portions in the printed circuit board 1, in which the wiring pattern is formed on the insulating substrate 2 by the metal conductor 3, and in which the solder resist 4 is formed on the surface of the wiring pattern of the metal conductor 3 except for the connection portion such as the solder ball terminal.

<Second Step>

Figure 3:
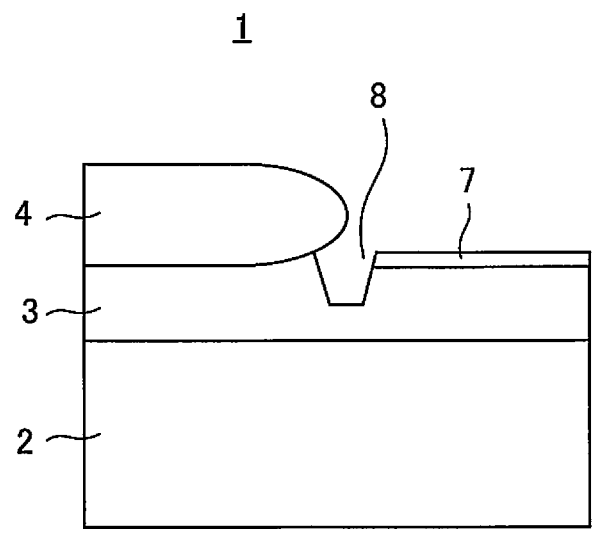
FIG. 3 is a view showing a cross-sectional structure of the printed circuit board which has been subjected only to an electroless plating process.

As a next step, the printed circuit board 1 shown in FIG. 1 is subjected to plating using an electroless plating process. FIG. 3 shows a cross-sectional structure of the printed circuit board 1 which has been subjected only to the electroless plating process. In the electroless plating process, when a displacement-type metal plating solution is used as a plating solution, the plating solution for forming a plating film 7 on the surface of the metal conductor 3 is easy to intrude into a gap between the end of the solder resist 4 and the metal conductor 3. For this reason, in the vicinity of this portion, plating metal ions are insufficiently supplied. As a result, the oxidation/dissolution of the metal conductor 3 such as copper foil, for instance, is easy to occur, and the metal conductor 3 is scooped out, leading to formation of a scooped-out portion 8. There is an etching method as another method of forming the scooped-out portion 8 on the metal conductor 3. The etching method is a method of chemically or electrochemically oxidizing/dissolving the metal conductor to remove the metal conductor. With the etching method, a scooped-out portion can be formed by a similar mechanism to that in the electroless plating process.

<Third Step>

As a next step, surface treatment using hot air leveling (HAL) process is conducted. The printed circuit board 1 has the protective layer formed thereon in the first step, which is formed of the solder resist 4. In addition, the metal conductor 3 has the scooped-out portion 8 formed thereon in the second step.

The printed circuit board 1 (see FIG. 3) which has been subjected to processing of the second step is immersed into a solder bath (not shown in the figure) that accommodates a molten solder therein, and then is subjected to treatment of blowing excess solder from the surface of the printed circuit board 1 with high-temperature and high-pressure air, while being raised from the solder bath.

As has been described above, in the case of a material having high viscosity such as solder, there is such a problem that the solder coat (thin film of solder) 5 which is formed on the surface of the metal conductor 3 by the hot air leveling (HAL) process does not easily adhere to the metal conductor 3 at a portion 6 of a particularly small gap between the solder resist 4 and the metal conductor 3 such as a gap between the end of the solder resist 4 and the metal conductor 3. In contrast, in the third step, the solder easily flows into the scooped-out portion 8 which has been formed in the second step, and the scooped-out portion 8 is coated with the solder.

Figure 4:
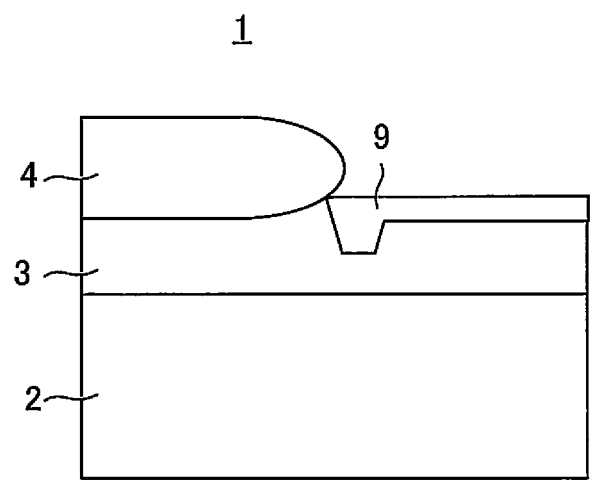
FIG. 4 is a view showing a cross-sectional structure of the printed circuit board which has been subjected to the hot air leveling (HAL) process and the electroless plating process.

FIG. 4 is a view showing a cross-sectional structure of the printed circuit board 1 with enhanced corrosion resistance, which has been manufactured in steps including the above described first to third steps. The molten solder flows into the scooped-out portion 8 which has been formed in the second step, and a solder coat 9 is formed there.

As has been described above, a plating film is formed, on the metal conductor 3 such as copper foil which has been stuck onto the insulating substrate 2 of the printed circuit board 1, by electroless plating process, as one of embodiments. A metal which can cause a displacement reaction with the metal conductor 3 needs to be selected for a plating film that is formed on the metal conductor 3 by electroless plating process. When the metal conductor 3 is copper foil, the metal which forms the plating film is preferably Sn (tin), Ag (silver), Au (gold) or the like.

What is claimed is:

1. A printed circuit board, comprising:
   an insulating substrate;
   a metal conductor formed on the insulating substrate;
   a solder resist coating a part of the metal conductor, wherein the metal conductor has a scooped-out portion formed in a region facing to an end of the solder resist; and
   a solder layer coating and filled in the scooped-out portion.

2. A method of manufacturing a printed circuit board which includes an insulating substrate, a metal conductor formed on the insulating substrate, and a solder resist coating a part of the metal conductor, the method comprising:
   a first step of forming a scooped-out portion in the metal conductor, the scooped-out portion formed in a region facing to an end of the solder resist, and
   a second step of coating and filling in the scooped-out portion with a solder layer.

* * * * *